(12) United States Patent
Matsumoto et al.

(10) Patent No.: US 9,607,834 B2
(45) Date of Patent: Mar. 28, 2017

(54) TRENCH AND HOLE PATTERNING WITH EUV RESISTS USING DUAL FREQUENCY CAPACITIVELY COUPLED PLASMA (CCP)

(71) Applicant: Tokyo Electron Limited, Tokyo (JP)

(72) Inventors: Hiroie Matsumoto, Watervliet, NY (US); Andrew W. Metz, Watervliet, NY (US); Yannick Feurprier, Albany, NY (US); Katie Lutker-Lee, Niskayuna, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/088,701

(22) Filed: Apr. 1, 2016

(65) Prior Publication Data

US 2016/0293405 A1    Oct. 6, 2016

Related U.S. Application Data

(60) Provisional application No. 62/142,020, filed on Apr. 2, 2015.

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *H01L 21/027* | (2006.01) |
| *G03F 7/20* | (2006.01) |
| *H01L 21/311* | (2006.01) |
| *H01L 21/3105* | (2006.01) |

(52) U.S. Cl.
CPC ............ *H01L 21/0274* (2013.01); *G03F 7/20* (2013.01); *H01L 21/0273* (2013.01); *H01L 21/31116* (2013.01); *H01L 21/31138* (2013.01); *H01L 21/31144* (2013.01); *H01L 21/31058* (2013.01)

(58) Field of Classification Search
CPC .................................................. H01L 21/0274
USPC ........................................................... 216/72
See application file for complete search history.

(56) References Cited

PUBLICATIONS

Feurprier Yannick et al.; "Trench and Hole patterning with Resists using Dual Frequency Capacitvely Coupled Plasma (CCP)"; Proc. of SPIE vol. 9428, pp. F1-F10, 2015.

(Continued)

*Primary Examiner* — Roberts Culbert
(74) *Attorney, Agent, or Firm* — Wood Herron & Evans LLP

(57) ABSTRACT

A method for etching an antireflective coating on a substrate is disclosed. The substrate comprises an organic layer, an antireflective coating layer disposed above the organic layer, and a photoresist layer disposed above the antireflective coating layer. The method includes patterning the photoresist layer to expose a non-masked portion of the antireflective coating layer and selectively depositing a carbon-containing layer on the non-masked portions of the antireflective coating layer and on non-sidewall portions of the patterned photoresist layer. The method further includes etching the film stack to remove the carbon-containing layer and to remove a partial thickness of the non-masked portions of the antireflective coating layer without reducing a thickness of the photoresist layer. The method further includes repeating the selective depositing and etching, at least until the complete thickness of the non-masked portions of the antireflective coating layer is removed, to expose the underlying organic layer.

20 Claims, 19 Drawing Sheets

(56) References Cited

PUBLICATIONS

Chu Changwoong et al.; "Effects of Fluorocarbon Polymoer Deposition on the Selective Etching of SiO2/Photoresist in High Density Plasma"; J. Vac. Sci. Technol. B; vol. 18, No. 6, pp. 2763-2768 Nov./Dec. 2000.
Kazuki Narishige et al.; "EUV Resist Curing Technique for LWR Reduction and Etch Selectivity Enhancement"; Proc. of SPIE vol. 8328, pp. N1-N6, 2012.
Hiroki Nakagawa et al.; "Ultra-thin Film EUV Resists beyond 20nm Lithography"; Proc. of SPIE vol. 7972, pp. I1-I7, 2011.
International Appl. No. PCT/US2016/025555, International Search Report and Written Opinion, Jun. 14, 2016.

| | PRESS. (mT) | HF (W) | LF (W) | DCS (V) | H2 | CH3F | CF4 | N2 |
|---|---|---|---|---|---|---|---|---|
| DEPO | 30 | 500 | 150 | 1500 | 330 | 40 | 50 | |
| CURE | 30 | 500 | 150 | 1500 | 450 | | | 450 |
| DEPO | 30 | 500 | 150 | 1500 | 330 | 40 | 50 | |
| CURE | 30 | 500 | 150 | 1500 | 450 | | | 450 |
| DEPO | 30 | 500 | 150 | 1500 | 330 | 40 | 50 | |
| CURE | 30 | 500 | 150 | 1500 | 450 | | | 450 |

FIG. 7

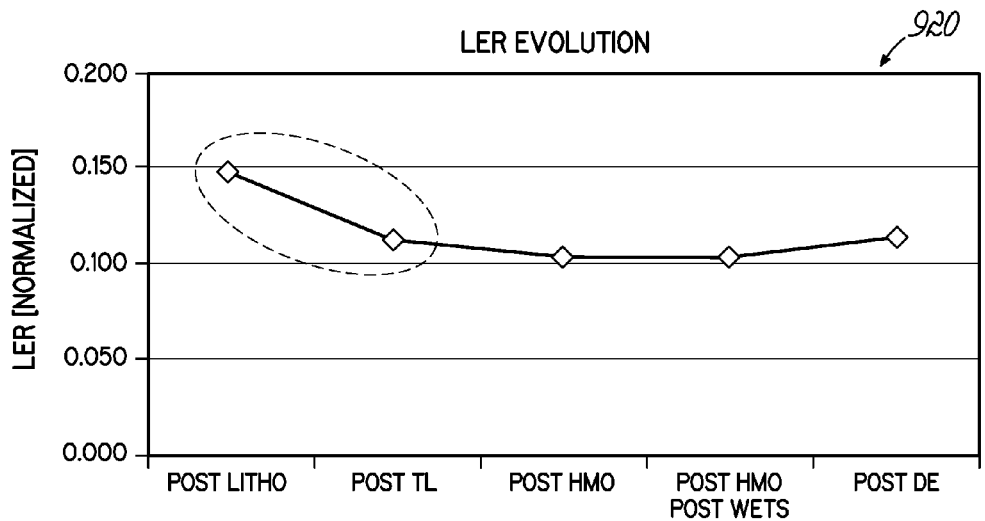
FIG. 9C
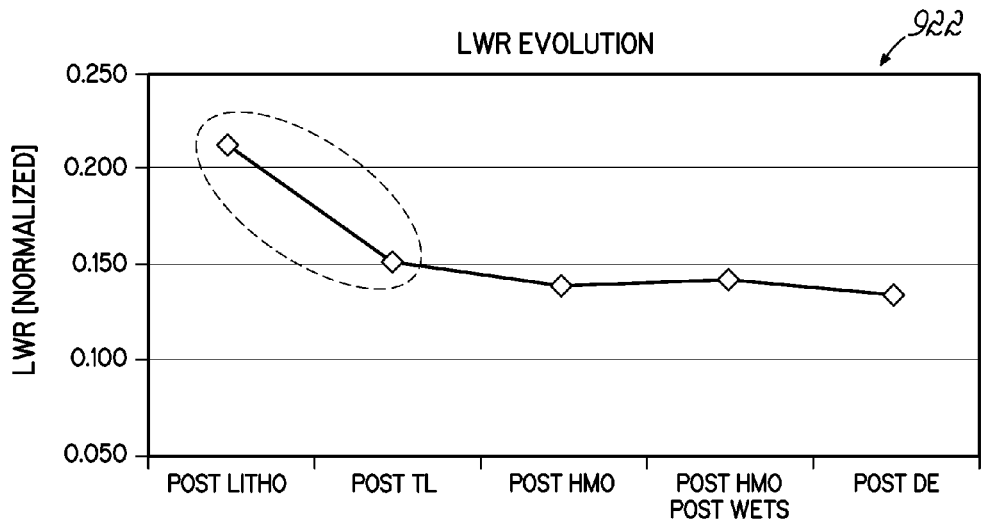
FIG. 9D
| PROCESS STEP | CDU 3σ [nm] |
|---|---|
| POST LITHO | 0.72 |
| POST TL ETCH | 0.75 |
| POST HMO ETCH | 0.81 |
| POST RIE WETS | 0.79 |
FIG. 9E

TRENCH AND HOLE PATTERNING WITH EUV RESISTS USING DUAL FREQUENCY CAPACITIVELY COUPLED PLASMA (CCP)

CROSS REFERENCE TO RELATED APPLICATION

Pursuant to 37 C.F.R. §1.78(a)(4), this application claims the benefit of and priority to prior filed co-pending Provisional Application Ser. No. 62/142,020, filed Apr. 2, 2015, which is expressly incorporated herein by reference.

FIELD OF THE INVENTION

This invention relates to semiconductor processing technology, and more particularly, to apparatus and methods for controlling properties of a processing system for treating a substrate.

BACKGROUND OF THE INVENTION

Patterning at 10 nm and sub-10 nm technology nodes is one of the key challenges for the semiconductor industry. Several patterning techniques are under investigation to enable the aggressive pitch requirements demanded by the logic technologies. Extreme ultraviolet (EUV) lithography based patterning is being considered as a serious candidate for the sub-10 nm nodes. One challenge of EUV technology is that EUV resists tend to have a lower etch selectivity and worse line edge roughness (LER) and line width roughness (LWR) than traditional 193 nm resists. Consequently, the characteristics of the dry etching process play an increasingly important role in defining the outcome of the patterning process.

Sub 30 nm node semiconductor manufacturing has imposed many challenges on the physical limits of traditional lithography techniques. There is a demand for alternative patterning strategies which involve augmentation of 193i lithography with LELE (Litho-Etch-Litho-Etch), SADP (Self Aligned Double Patterning) and SAQP (Self Aligned Quadruple Patterning). However, multiple patterning schemes bring additional challenges in the form of edge placement error, higher costs due to a larger number of passes through lithography and other processing steps, and the introduction of pitch walking at several processing steps.

SUMMARY OF THE INVENTION

Disclosed methods provide greater EUV photoresist etch selectivity and markedly reduced line edge roughness (LER) and line width roughness (LWR) in comparison with conventional approaches.

According to an embodiment, a method for etching an antireflective coating layer on a substrate is disclosed. The substrate comprises an organic layer, an antireflective coating layer disposed above the organic layer, and a photoresist layer disposed above the antireflective coating layer. The method includes patterning the photoresist layer to expose a non-masked portion of the antireflective coating layer and selectively depositing a carbon-containing layer on the non-masked portions of the antireflective coating layer and on non-sidewall portions of the patterned photoresist layer. The method further includes etching the film stack to remove the carbon-containing layer and to remove a partial thickness of the non-masked portions of the antireflective coating layer without reducing a thickness of the photoresist layer. The method further includes repeating the selective depositing and etching, at least until the complete thickness of the non-masked portions of the antireflective coating layer is removed, to expose the underlying organic layer.

According to an embodiment, a further method of etching a patterned substrate is disclosed. The method includes providing a patterned substrate that includes a patterned extreme ultraviolet (EUV) photoresist, a transfer layer (TL), and an organic planarizing layer (OPL). The method further includes repeatedly performing a deposition/etch process to selectively and incrementally etch through the TL and into the OPL, wherein the EUV photoresist and TL serve as a mask to transfer the pattern from the EUV photoresist to the OPL. The deposition/etch process includes the following two sub-processes in sequence. In a first sub-process (1), the method includes depositing a fluorocarbon layer on the patterned substrate, including deposition on the EUV photoresist and exposed portions of the TL or OPL. In a second sub-process (2), the method includes reactive ion etching to remove the fluorocarbon layer and an incremental portion of the TL or OPL selectively relative to the EUV photoresist. The method further includes repeatedly performing the deposition/etch sub-processes (1) and (2) to etch the TL and OPL with greater photoresist etch selectivity than is obtained by performing a reactive ion etch process alone.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

FIG. 7 is a table illustrating the process conditions for an example deposition/etch process, according to an embodiment.

FIGS. 9A-9E illustrate evolution of LER and LWR during trench patterning using EUV lithography showing improvement of LER and LWR due to the use of the deposition/etch process, according to an embodiment.

DETAILED DESCRIPTION

The following Detailed Description refers to accompanying drawings to illustrate exemplary embodiments consistent with the disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other embodiments are possible, and modifications can be made to exemplary embodiments within the scope of the disclosure. Therefore, the Detailed Description is not meant to limit the disclosure. Rather, the scope of the disclosure is defined only in accordance with the following claims and their equivalents.

The following Detailed Description of the exemplary embodiments will so fully reveal the general nature of the disclosure that others can, by applying knowledge of those skilled in the relevant art(s), readily modify and/or adapt for various applications such exemplary embodiments, without undue experimentation, without departing from the scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the instant specification is to be interpreted by those skilled in relevant art(s) in light of the teachings herein.

Sub 30 nm node semiconductor manufacturing has imposed many challenges on the physical limits of traditional lithography techniques. EUV lithography is a promising approach to confront the challenges of patterning at 10 nm and sub-10 nm technology nodes. EUV lithography, however, also suffers from a number of significant challenges as illustrated, for example, in FIGS. 1A-1C.

Figure 1A:
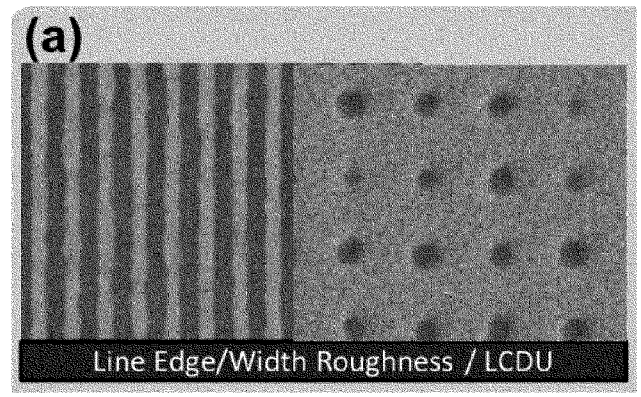
FIG. 1A illustrates line edge roughness (LER), line width roughness (LWR), and contact edge roughness, resulting from conventional EUV lithography techniques.
Figure 1B:
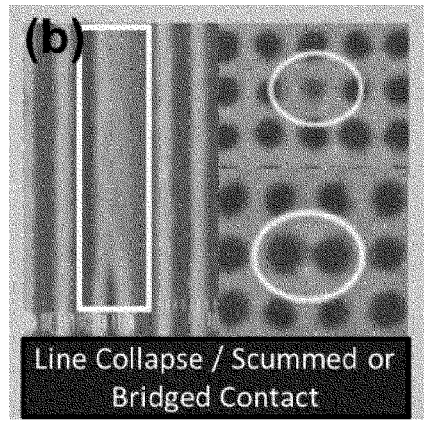
FIG. 1B illustrates higher defectivity, resulting from conventional EUV lithography techniques, which may lead to chip failure during electrical testing.
Figure 1C:
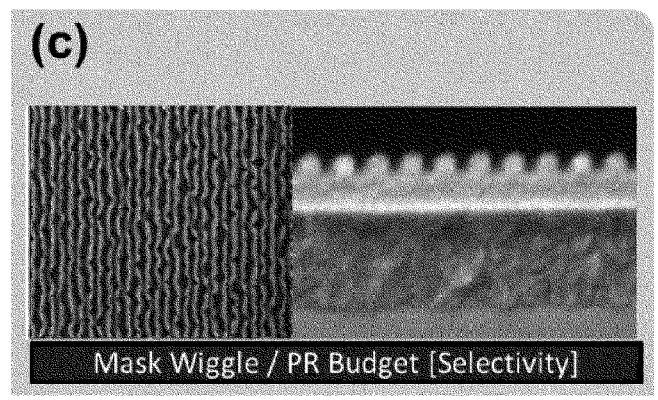
FIG. 1C illustrates diminished etch resistance and low resist margin, resulting from conventional EUV lithography techniques, which demands a high selectivity transfer layer etch.

FIG. 1A illustrates line edge roughness, line width roughness, and contact edge roughness, resulting from conventional EUV lithography techniques. In another example, FIG. 1B illustrates higher defectivity, resulting from conventional EUV lithography techniques, which may lead to chip failure during electrical testing. In a further example, FIG. 1C illustrates diminished etch resistance and low resist margin, resulting from conventional EUV lithography techniques, which demands a high selectivity transfer layer etch.

The photoresist budget has been constantly shrinking with each technology node. The capability of performing lithography at smaller pitches comes with a tradeoff in PR thickness. The typical thickness of PR for sub-30 nm technology nodes ranges between 60-20 nm, with smaller technology nodes having thinner incoming resist available for dry etch. Additionally, etch resistance of EUV resist is much less than 193/193i lithography resist, posing further demands on etch process development to provide higher selectivity processes. Efforts to overcome these challenges include EUV source optimization and development of new EUV resist materials.

This disclosure presents lithography techniques based on Capacitively Coupled Plasma (CCP) dry etching methodologies to meet EUV patterning challenges. The disclosed systems and methods use dual-frequency CCP in a patterning process that includes a repeated deposition/etch process. As described below, the disclosed embodiments show improvements in LER/LWR, resist selectivity, and critical dimension (CD) tunability for holes and line patterns. Results obtained using the disclosed embodiments are compared to results obtained using traditional plasma curing methods. Data from a systematic study, which shows the role of various plasma etch parameters that influence the key patterning metrics of CD, resist selectivity, and LER/LWR, is presented.

According to an embodiment, one technique for improving LER and LWR, involves superimposing a negative DC voltage in a radio-frequency (RF) plasma at one of the electrodes of a plasma reactor. The resulting emission of ballistic electrons, in concert with the plasma chemistry, has shown to improve LER and LWR, as described in further detail below.

Figure 2:
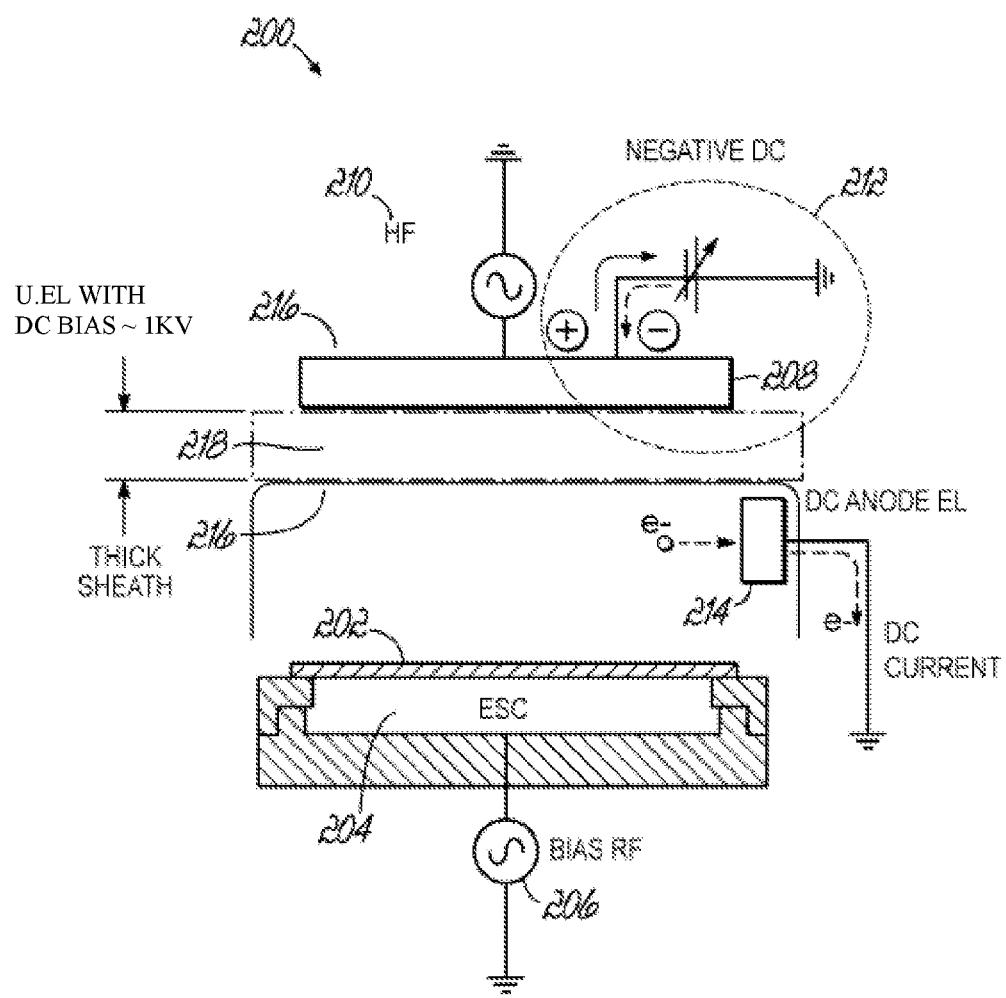
FIG. 2 is a schematic illustration 200 of a dual-frequency Capacitively Coupled Plasma (CCP) reactor used to etch EUV patterned substrates, according to an embodiment.

FIG. 2 is a schematic illustration 200 of a dual-frequency CCP reactor used to etch EUV patterned substrates, according to an embodiment. A wafer 202 to be patterned is mounted to an electrostatic chuck (ESC) 204. According to an embodiment, a bias RF voltage 206 may be applied to the ESC to fix the voltage of the wafer 202. The reactor may include an upper electrode (EL) 208 to which a high frequency (HF) voltage 210 may be applied. In addition to the HF voltage 210, a negative DC voltage 212 may also be applied to the upper EL 208. A DC anode EL 214 may also be provided, according to an embodiment. According to an embodiment, a 1 kV DC bias 215 may be applied between the upper EL 208 and the DC anode EL 214.

According to an embodiment, an ionized plasma is generated in the reactor of FIG. 2 through the introduction of process gasses and the application of bias voltages 206 to the ESC 204, the upper EL 208 and the anode EL 214. According to an embodiment, the process gasses may include Ar, $N_2H_2$, and various fluorocarbons ($CF_x$). Application of a DC potential to the upper EL 208 creates a plasma having a lower region 216 and an upper region 218. The upper region 218 is a sheath having higher plasma density, and more uniform radial distribution of plasma, than the lower region 216. The process of generating a plasma using the above-described DC potential is called Direct Current Superposition (DCS), or DCS cure, as described in further detail below (with reference to FIGS. 4A-4B and related discussion).

Initial etch feasibility studies utilizing EUV based photoresists were executed on relaxed pitch samples to gauge the impact of resist material change on CD bias control and pattern fidelity. For this work, the patterning was done using an IBM EUV lithography tool set.

Figure 3A:
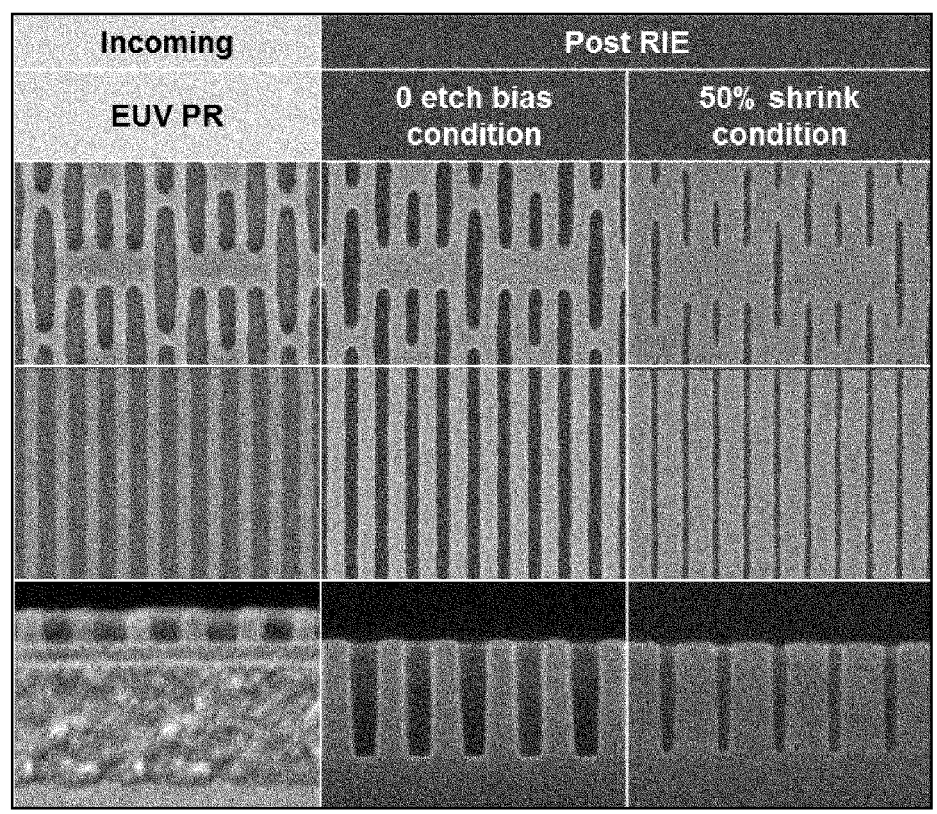
FIG. 3A illustrates top-down and cross sectional electron micrographs of line/space and contact/bar reference structures after lithography and after etch pattern transfer, according to an embodiment.
Figure 3B:
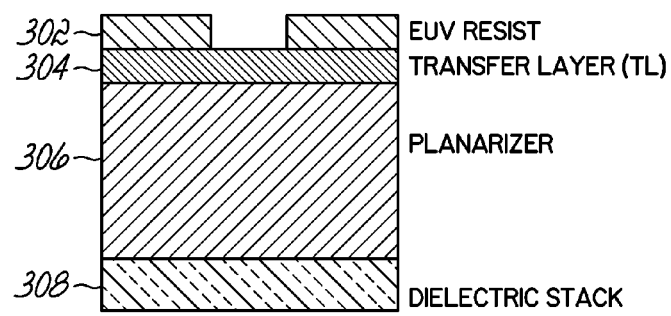
FIG. 3B is a schematic illustration of a typical material layer stack for EUV patterning, according to an embodiment.
Figure 3C:
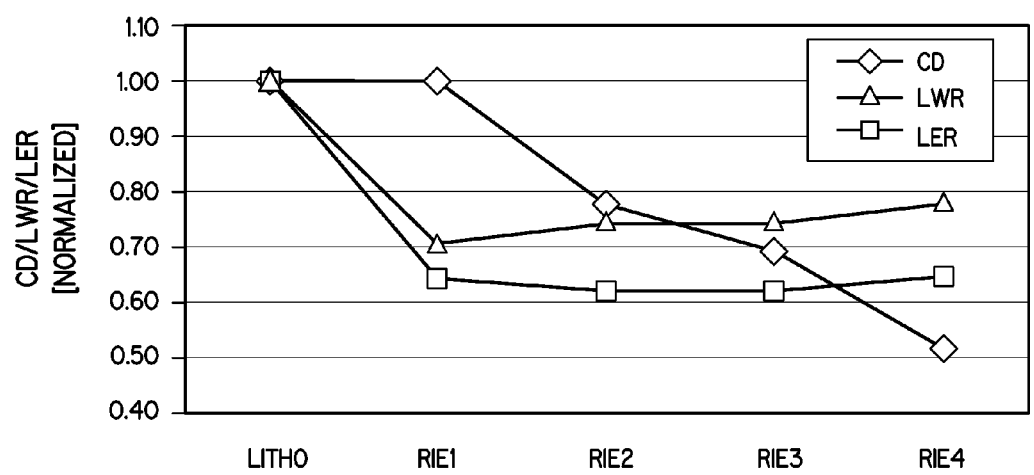
FIG. 3C is a plot of normalized values of critical dimension, LER and LWR at each step of processing, according to an embodiment.

FIGS. 3A-3C illustrate the results of initial etch feasibility studies, according to an embodiment. FIG. 3A illustrates top-down and cross sectional electron micrographs of line/space and contact/bar reference structures after lithography and after etch pattern transfer, according to an embodiment. FIG. 3B is a schematic illustration of a typical material layer stack for EUV patterning, according to an embodiment. A trilayer patterning scheme was used: a photoresist (PR) 302, a transfer layer (TL) 304, and an organic planarizer layer (OPL) 306. The TL 304 was chosen for its high degree of plasma etch selectivity to both the PR 302 and OPL 306, while the OPL 306, as its name suggests, has the benefit to planarize any existing topography. According to an embodiment, the trilayer stack may be generated on top of a dielectric stack 308.

Four reactive ion etch (RIE) process conditions, referred to as RIE1-RIE4, were developed for the transfer layer open, showing CD bias control from 0 to 50% of incoming develop CD as shown, for example, in FIG. 3A. In RIE1-4, variations were made in one or more of time, pressure, electrode frequencies, DC potential, gas flow rates, or substrate temperature. The PR budget was initially thought to be insufficient to prevent LER degradation and bridging in the leaner '0 etch bias' case. However, no LER degradation and bridging was observed, proving this suspicion incorrect. Furthermore, all etch cases exhibit a dramatic improvement of LWR of approximately 63% relative to incoming (i.e., relative to the incoming patterned resist), independent of etch condition. LER degraded slightly as a function of CD bias, and may be an indication that fluorocarbon (CFx) passivation used in the transfer layer open is greater than desired and contributes to LER generation as illustrated, for example, in FIG. 3C. FIG. 3C is a plot of normalized values of critical dimension, LER and LWR at each step of processing, according to an embodiment.

Aggressive pitch scaling for line-space applications leads to a high aspect ratio in the photoresist, thereby inducing pattern collapse marginality. Concurrent with EUV resist height scaling, it is desirable to reduce TL thickness to reduce the etch selectivity requirement. Lower limits on TL thickness are in part dictated by hermeticity to resist solvent and developer solutions. One of the challenges associated with EUV resists is the selectivity when transferring the pattern to the TL. Therefore, in order to enable good pattern transfer with reduced LER and LWR, it is desirable to have good resist selectivity. To achieve reasonable pattern transfer fidelity, it is estimated that etch selectivity should be TL: EUV PR>5:1, according to an embodiment.

The above-described results are typical of conventional EUV lithography techniques. According to an embodiment, improved results can be obtained through the use of DCS technology, as discussed in the following.

Figure 4A:
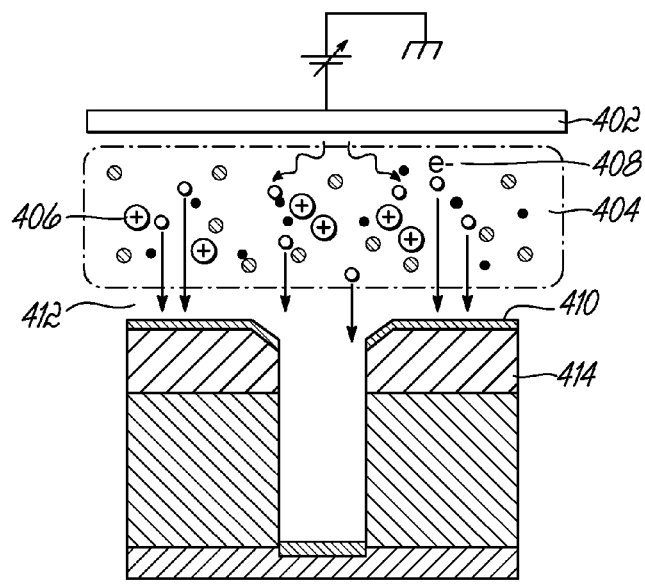
FIG. 4A is a schematic illustration of the process of Direct Current Superposition (DCS) resulting from application of a DC potential to a top electrode of a CCP chamber, according to an embodiment.

FIG. 4A is a schematic illustration of the process of DCS resulting from application of a DC potential to a top electrode of a CCP chamber, according to an embodiment. In this process, application of a DC potential to the upper EL 402 creates a thicker top sheath 404, changing the radial distribution of the plasma and increasing plasma density relative to plasmas generated without the application of a DC bias.

Additionally, according to an embodiment, the DC potential accelerates positive ions 406 toward the upper electrode. The impact of positive ions on the upper electrode generates secondary electron emission 408 that is accelerated by the DC potential toward the wafer surface 410. The electrons are of sufficient energy to penetrate a bottom sheath 412 and affect processes at the wafer surface 410, including charge cancellation and cross-linking of organic films comprising the resist 414. This electron beam induced cross-linking/hardening may improve etch selectivity to organic photoresists and organic planarizers.

Figure 4B:
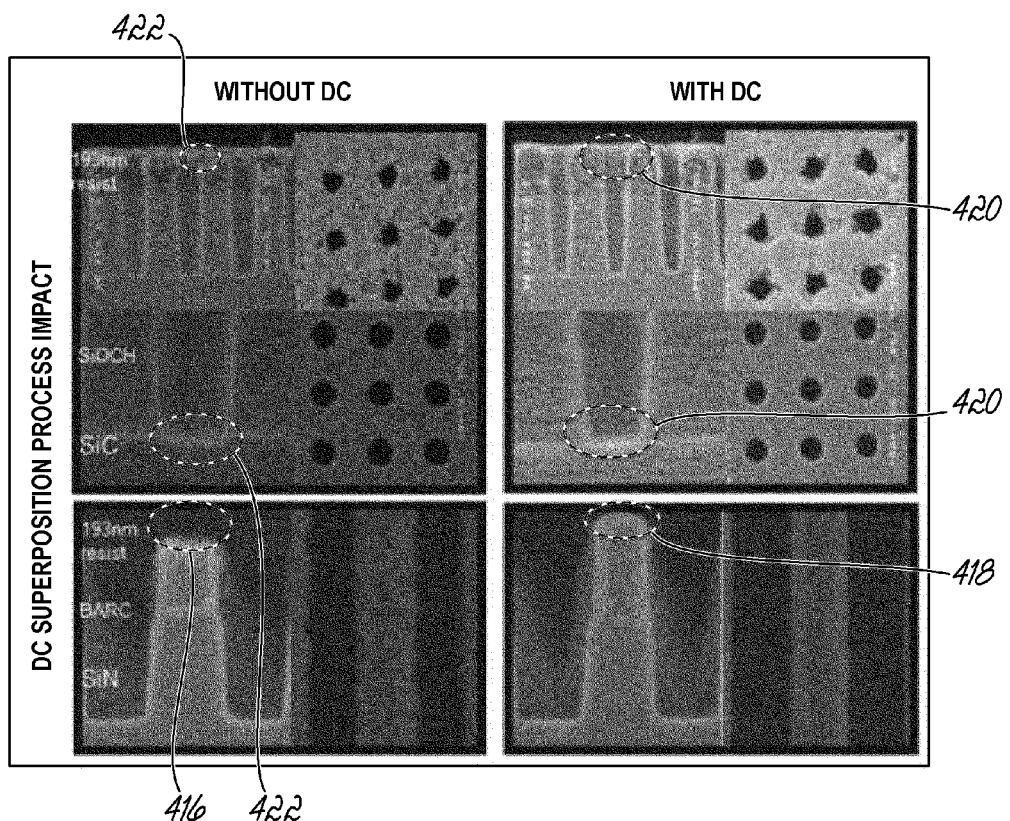
FIG. 4B illustrates top-down and cross section electron microscopy images showing the impact of DCS on organic selectivity during transfer layer etch, according to an embodiment.

FIG. 4B illustrates top-down and cross section electron microscopy images showing the impact of DCS on organic selectivity during transfer layer etch, according to an embodiment. Clearly, more resist is consumed 416 using the process without DCS in comparison with the result 418 obtained with the use of DCS. Further, an improved CD bias 420 is obtained using DCS than the bias 422 obtained when DCS is not used. Further comparisons of results obtained with and without DCS are presented in the following.

Figures 5A, 5B:
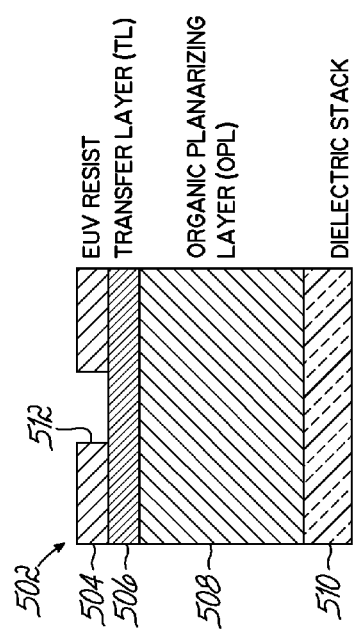
FIG. 5A illustrates schematically an incoming stack for EUV patterning.
FIG. 5B illustrates cross section electron microscopy images showing the effects of DCS cure and etch process optimization on resist selectivity in an application of EUV lithography to trench patterning of the stack of FIG. 5A, according to an embodiment.

FIG. 5A schematically depicts a stack for EUV patterning and FIG. 5B illustrates cross section electron microscopy images of the stack showing the effects of DCS cure and etch process optimization on resist selectivity in an application of EUV lithography to trench patterning, according to an embodiment. In this example, as shown schematically in FIG. 5A, a stack for EUV patterning 502 comprises an EUV patterned PR 504, a TL 506, and an organic planarizing layer (OPL) 508, constructed on top of a dielectric stack 510. The PR 504 was patterned having features 512 exhibiting a pitch of less than 40 nm.

The first panel 514 of FIG. 5B is a cross section electron microscopy image of the incoming patterned substrate before etching. The second panel 516 of FIG. 5B shows the results of a conventional Transfer Layer open applied to trenches. It has low resist selectivity (i.e., 1.3:1) to EUV resist and most of the resist is consumed during the TL open, resulting in poor pattern transfer. In the third panel 518, a DC voltage based treatment was employed prior to the Transfer Layer open process. Ballistic electrons generated by the DC voltage applied to the upper electrode may be collected at the wafer level and may result in the modification and hardening or curing of the resist. For this EUV resist, the DC voltage-based pre-treatment also showed a resist selectivity increase to 2.2:1.

The fourth panel 520 of FIG. 5B shows an increase in resist selectivity resulting from a reduction in the ion energy. In this example, a reduction of the ion energy in the Transfer Layer open step enhanced the resist selectivity to 3.6:1. Reduction in ion energy also improved the EUV resist profile enabling maintenance of a straighter profile with less resist corner "erosion."

According to an embodiment, the results of FIG. 5B illustrate that the selectivity to the EUV resist can be incrementally increased for a conventional TL open process. To dramatically improve the resist selectivity, a repeated deposition/etch process was developed, as described in greater detail below. Results obtained using the repeated deposition/etch process are shown in the fifth panel 522 of FIG. 5B. This result shows a dramatic improvement, from 3.6:1 to 7.8:1, in resist etch selectivity using the deposition/etch process of an embodiment of the invention.

Figure 6:
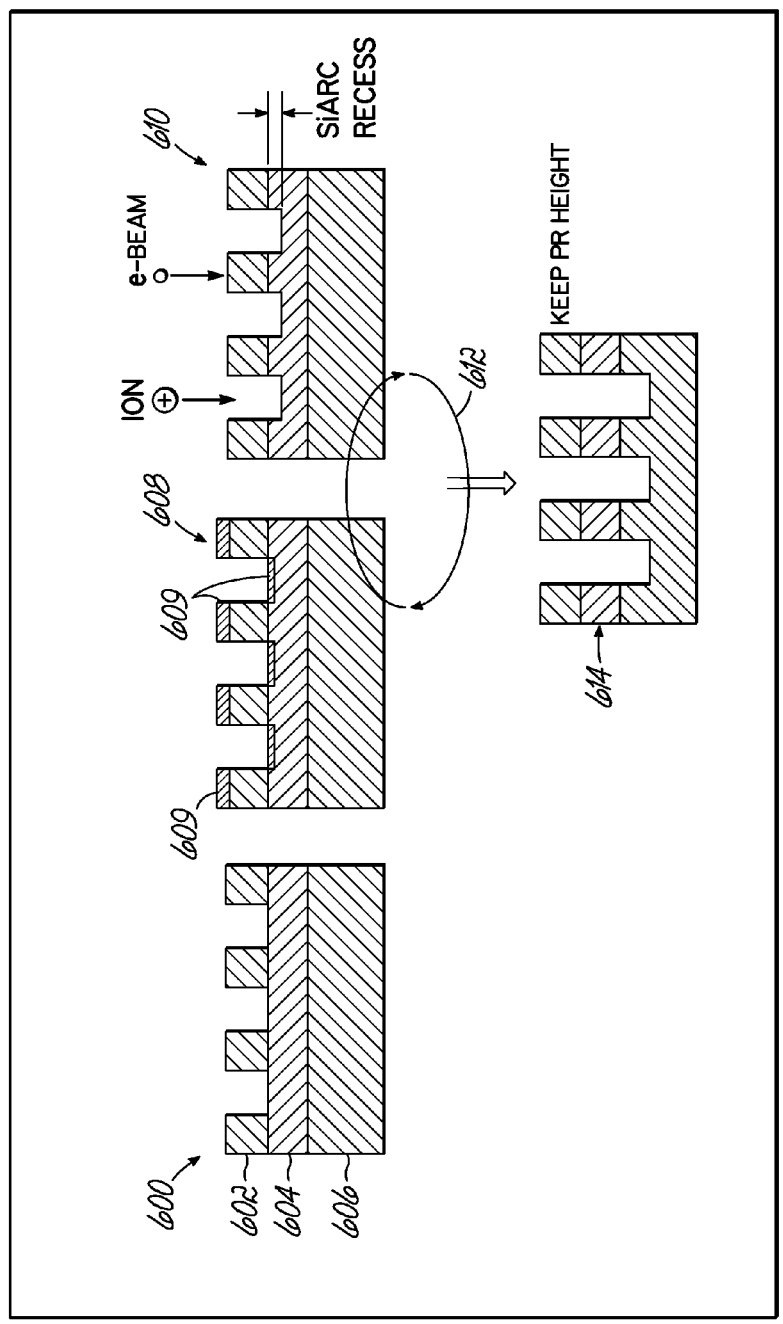
FIG. 6 is a schematic illustration of a repeated deposition/etch process, according to an embodiment.

FIG. 6 is a schematic illustration of the above-mentioned repeated deposition/etch process, according to an embodiment. This approach is based on a process sequence consisting of a deposition process followed by an etch process. In this example, an incoming substrate 600 comprises a PR 602, a TL 604, and an organic layer 606, such as an OPL. According to an embodiment, the PR 602 is an organic photoresist, for example, an EUV photoresist. Also, according to an embodiment, the TL 604 may be a silicon anti-reflection coating (SiARC). The PR 602 is patterned, such that the PR 602 masks a portion of the underlying TL 604, while exposing non-masked portions of the TL 604.

In a first step or stage, a deposition process 608 is performed. According to an embodiment, a carbon-containing layer 609, such as a fluorocarbon ($CF_x$) polymer, may be deposited on the substrate during the deposition process 608. Advantageously, the $CF_x$ polymer deposits on the exposed non-masked portions of the TL 604 and on non-sidewall portions of the PR 602. Ion fluxes and the flux of $CF_x$ radicals may be controlled through the application of a DC voltage to the upper EL (e.g., 402 in FIG. 4). According to an embodiment, the ion flux may have relatively low energy (e.g., <100 eV). In the deposition step 608, the gas flow of the fluorocarbon gas controls the $CF_x$ radical flux therefore controlling the deposition. According to an embodiment, the $CF_x$ polymer deposits preferentially on the resist patterns. In other words, the $CF_x$ polymer deposits to a greater thickness on the non-sidewall portions of the PR 602 than on the non-masked portions of the TL 604.

According to an embodiment, in a second step or stage, a reactive ion etch 610 is performed. In the reactive ion etch 610, a portion of the TL 604 may be preferentially etched while the PR 602 largely remains. To state another way, a partial thickness of the TL 604 is etched without reducing the thickness of the PR 602 to any appreciable extent. In one embodiment, DCS is used during the etch 610 which hardens (cures) the PR 602 as the TL 604 is etched, thereby facilitating the preferential etch.

In a further step or stage, as indicated by arrow 612, the sequential process of deposition 608 then etching 610 is repeated. As the repeated process progresses, the TL 604 is etched through followed by etching of the underlying OPL to transfer the pattern into the OPL 606. According to an embodiment, this repeated process results in a structure 614 in which the TL 604 and planarizing layer are etched through while the PR is left reasonably intact. The number of times the sequential deposition 608/etch 610 process must be repeated is determined by the initial thickness of the TL 604 and organic layer 606 thickness and the partial thickness etched in each iteration.

FIG. 7 is a table 700 illustrating the process conditions for an example deposition/etch, according to an embodiment. In this example, during the first deposition process 702 fluorocarbons $CH_3F$ 704 and $CF_4$ 706 are introduced into the plasma reactor along with $H_2$ 708 at gas flow rates of 40 sccm, 50 sccm, and 330 sccm, respectively. During the first etch/cure process 710, the flow of fluorocarbons 704 and 706 is stopped and $H_2$ 708 and $N_2$ 712 are introduced into the plasma reactor, each at a gas flow rate of 450 sccm. The alternating deposition/etch (cure) is then repeated for a predetermined number of iterations.

In this example, the combined deposition/etch (cure) process is repeated three times. In other embodiments, the deposition/etch (cure) process may be repeated any number of predetermined times as needed. Other process parameters provided in table 700 include the gas pressure 714, the power 716 supplied to the upper EL 208 (see FIG. 2) at high frequency (HF), the power 718 supplied to the ESC 204 (see FIG. 2), and the DC voltage 720 applied to the upper EL 208 (see FIG. 2).

Figure 8:
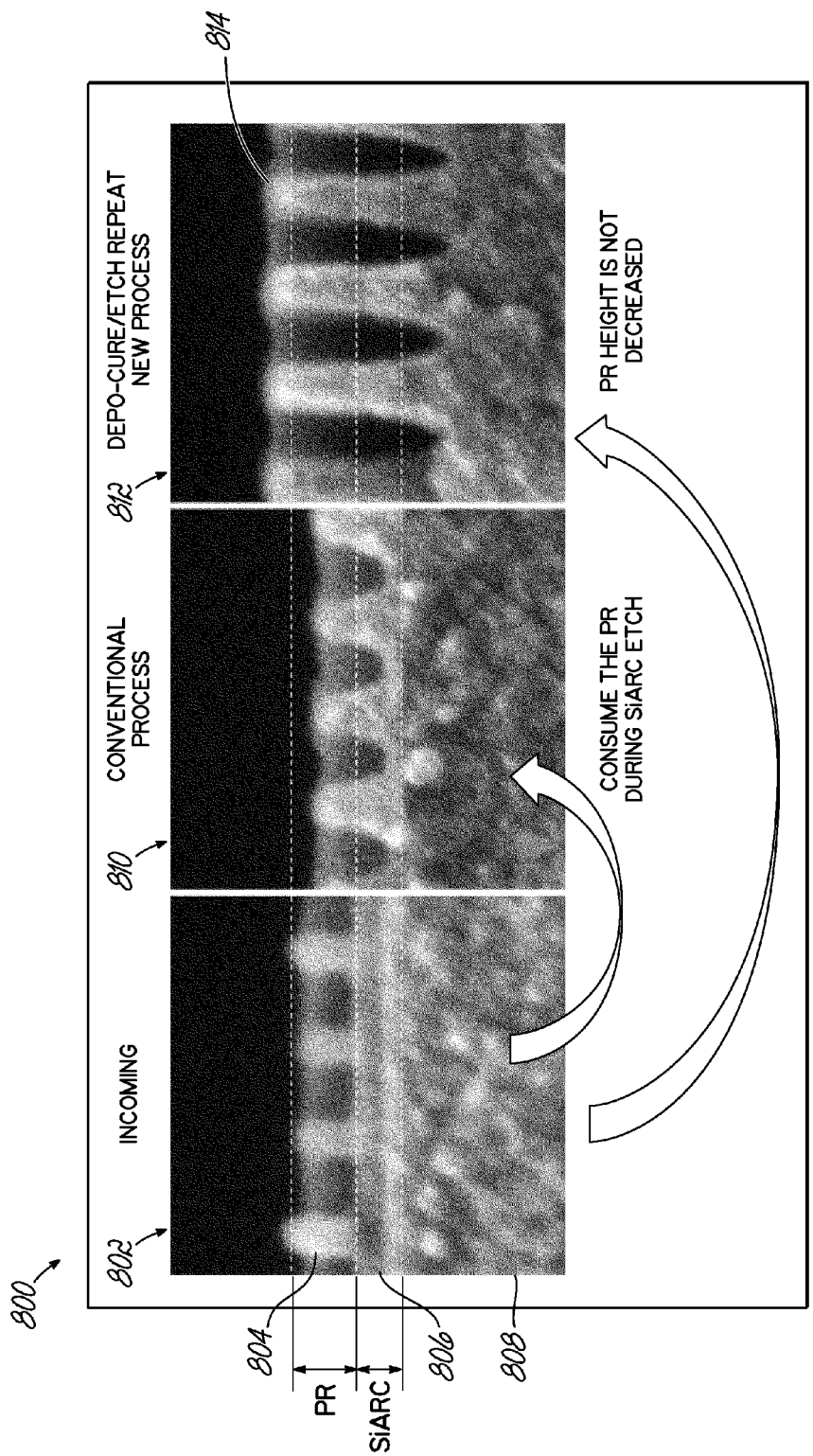
FIG. 8 illustrates cross section electron microscopy images showing the effects of the deposition/etch process in comparison with a conventional etch, according to an embodiment.

FIG. 8 illustrates cross section electron microscopy images 800 showing the effects of the deposition/etch process in comparison with a conventional etch, according to an embodiment. The first image 802 shows the incoming substrate having a patterned PR 804, a SiARC transfer layer 806, and an OPL 808. The second image 810 clearly shows that with a conventional process the PR 804 is consumed during the SiARC etching process. The third image 812 shows the results of the deposition/etch (cure) process, of an embodiment of the invention, after the SiARC 806 has been etched and the OPL 808 has been partially etched. In this example, the PR 814 remains intact and the height of the PR 814 has not decreased.

FIGS. 9A-9E illustrate evolution of LER and LWR during trench patterning using EUV lithography showing improvement of LER and LWR due to the use of one cycle of the deposition/etch process, according to an embodiment. The DC voltage-based plasma condition facilitates a good control of the $CF_x$ radical flux at relatively low ion energy, which helps to maintain the resist budget and the resist profile.

Figure 9A:
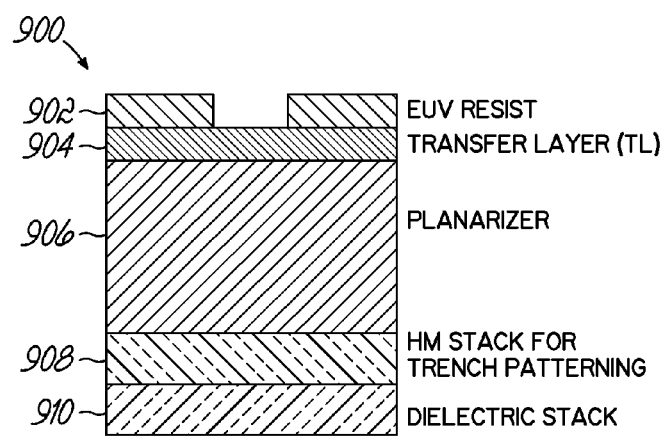

FIG. 9A is a schematic cross-sectional view of the incoming substrate 900. The incoming substrate 900 includes a patterned resist 902, a transfer layer 904, and a planarizer 906. According to an embodiment, the substrate 900 may also include a hard mask (HM) stack 908. The HM stack 908 may be provided on top of a dielectric stack 910 and may be used to pattern the dielectric stack 910.

Figure 9B:
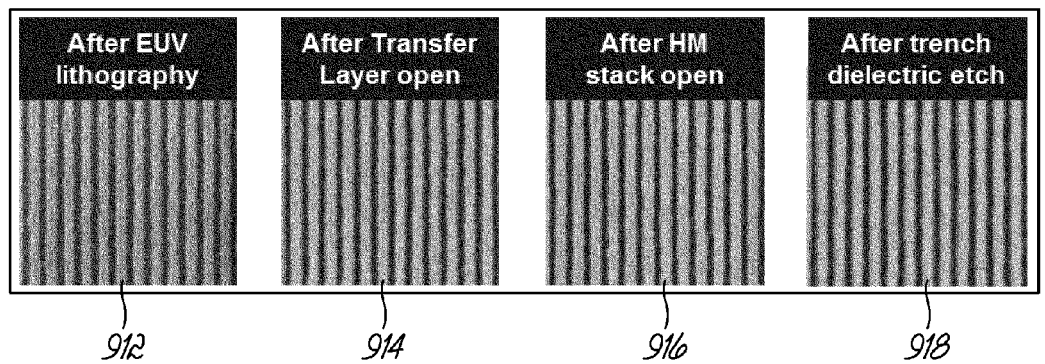

FIG. 9B includes top-down electron microscopy images 912, 914, 916, and 918, illustrating the features of the etched substrate at different stages of the etching process. Image 912 shows the substrate after EUV lithography. Image 914 shows the substrate after the TL etch ("TL open") process. Image 916 shows the substrate after the HM stack open process. Image 918 shows the substrate after the trench and dielectric etch process. The results for LER evolution are shown in the graph 920 of FIG. 9C. The results for LWR evolution are shown in graph 922 of FIG. 9D. These results show a good CD uniformity, measured after TL layer open, is achieved. These results also show a reduction of about 25-30% of the measured LER and LWR, as summarized in table 924 of FIG. 9E.

FIGS. 10A-10E illustrate the effect aspect ratio has on pattern wiggling and distortion using one cycle of the deposition/etch process, according to an embodiment. Unlike multiple patterning schemes, EUV lithography allows the complete line-space pattern to be exposed in a single pass. As the line-space pitch is decreased, the high aspect ratio of the soft mask results in a reduction in its relative mechanical stability. This leads to aspect ratio dependent pattern distortion and wiggling.

Figure 10A:
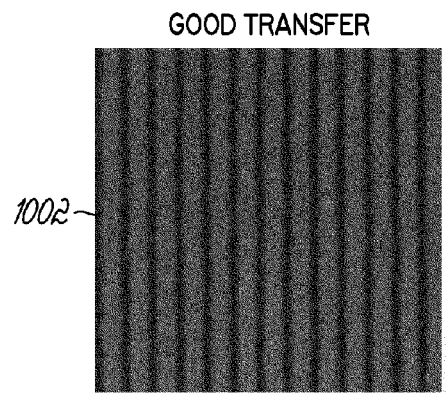
FIGS. 10A-10E illustrate the effect aspect ratio has on pattern wiggling and distortion.
Figure 10B:
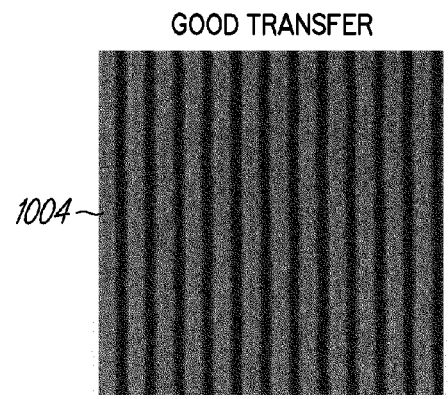
Figure 10C:
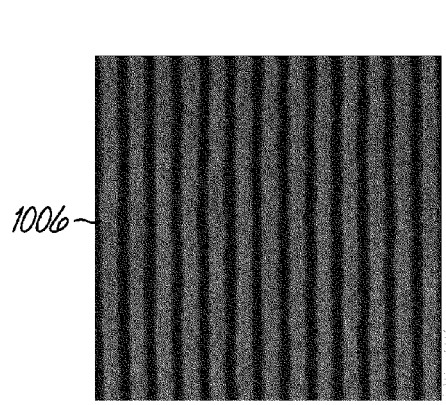
Figure 10D:
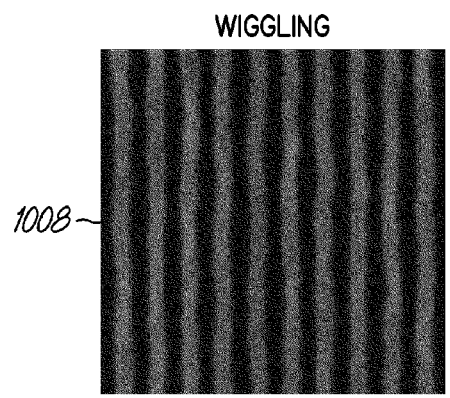

In FIG. 10A, a top-down electron micrograph image 1002 illustrates good results for patterning a substrate having an aspect ratio of approximately 4.1. In FIG. 10B, a similar top-down electron micrograph image 1004 illustrates good results for patterning a substrate having an aspect ratio of approximately 4.25. However, distortion in the resulting patterned substrate is observed for substrates having aspect ratios larger than approximately 4.5. For example, in FIG. 10C, a top-down electron micrograph image 1006 illustrates pattern distortions (i.e., LER and LWR) for patterning a substrate having an aspect ratio of approximately 4.6. A pronounced wiggling distortion is observed for a substrate having an aspect ratio of approximately 6.1, as shown in FIG. 10D in top-down electron micrograph image 1008. The results of FIGS. 10A-10D are graphically depicted in FIG. 10E, where normalized CD is shown as a function of aspect ratio.

Figure 10E:
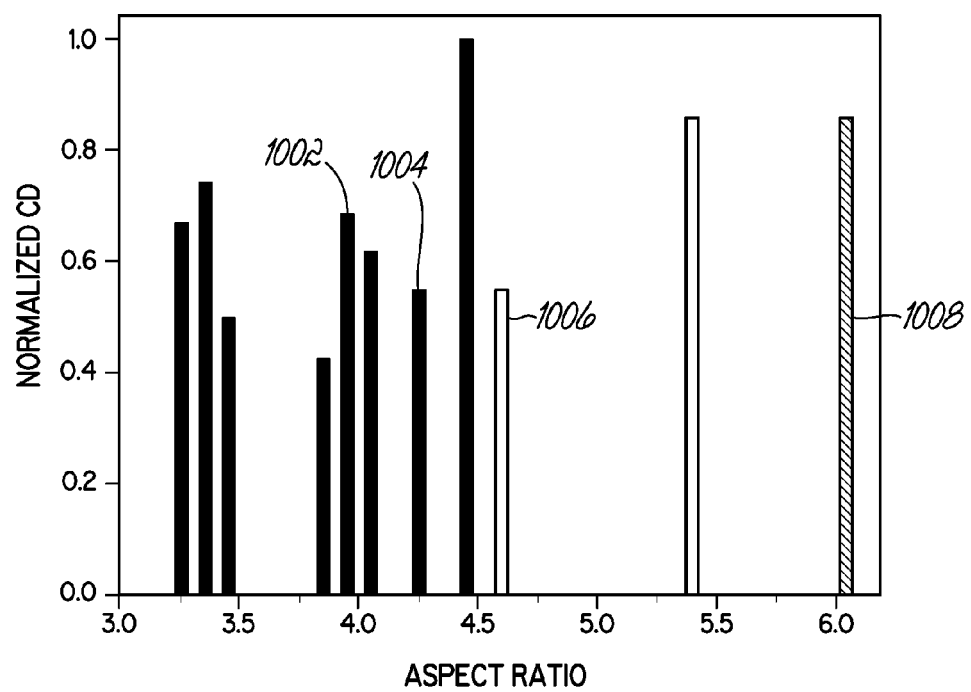

According to an embodiment, keeping the aspect ratio of the soft mask under 4.5 allows good pattern transfer to the hard mask to be achieved, even at a small pitch size, as shown in FIGS. 10A, 10B, and 10E. At an aspect ratio above 6.0, the soft mask is no longer able to maintain the pattern, and wiggling is induced, as shown in image 1008 in FIG. 10D and in FIG. 10E. Between the aspect ratios 4.5 and 6.0, a small amount of pattern distortion is observed, as shown in FIGS. 10C and 10E.

The aspect ratio of the soft mask is dictated by the pitch dimension required by integration and the planarizer material performance. A thinner planarizing layer reduces the aspect ratio, but the process of producing such a layer reliably can be challenging and constrains the design of the stack. In addition, there is consequently a thinner soft mask during the ensuing steps, requiring additional high selectivity processes. The onset of pattern distortion may also depend on the etch chemistry used to etch the planarizing layer. The utilization of new etch chemistries and conditions may lend added rigidity to the soft mask and enable a wiggle-free process at higher aspect ratios.

Top-down inspection through a partition of the etch sequence, as shown in FIGS. 9A-9E, for example, provides some additional insight into the mechanism inducing line wiggle. Although edge roughness is apparent after TL strip, mask CD growth and significant line wiggle degradation after oxide etch is observed. It is possible that either $CF_x$ deposition or swelling of the soft mask from plasma chemistry exposure induces a compressive stress that is relieved through the line wiggle. This non-ideality may be transferred directly to the dielectric as shown in the post-ash image (discussed further below with reference to FIGS. 11A-11B). Application of a DCS cure prior to, or during, TL open may eliminate this wiggling phenomenon. At aggressive <40 nm pitch, where the wiggling is most apparent, the effect is dramatic and readily apparent by visual inspection, as shown in FIGS. 11A-11B, and described in further detail below.

Figure 11A:
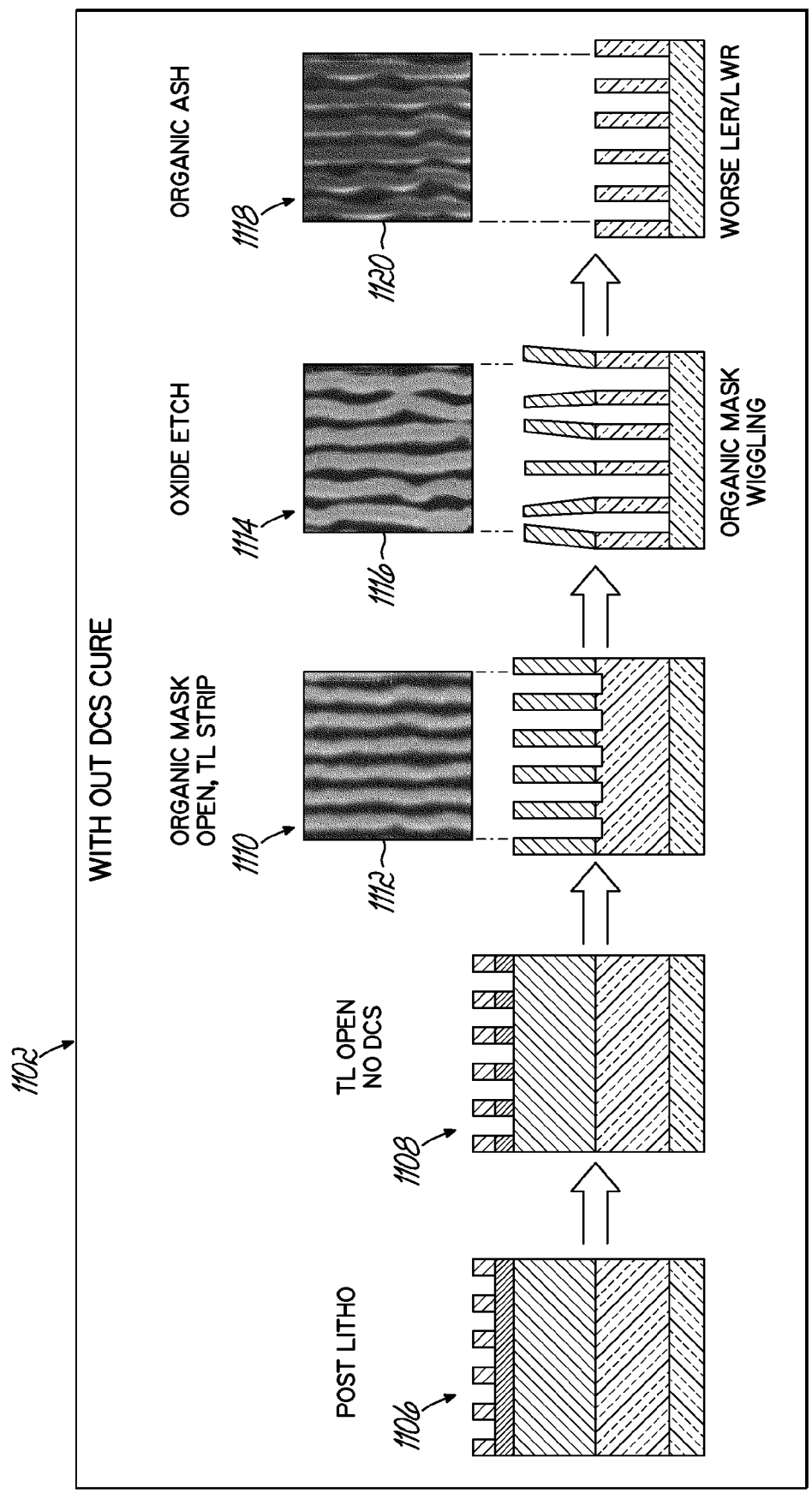
FIG. 11A illustrates the mechanical stability of the organic planarizer layer and resulting downstream pattern roughness, as obtained using conventional techniques.
Figure 11B:
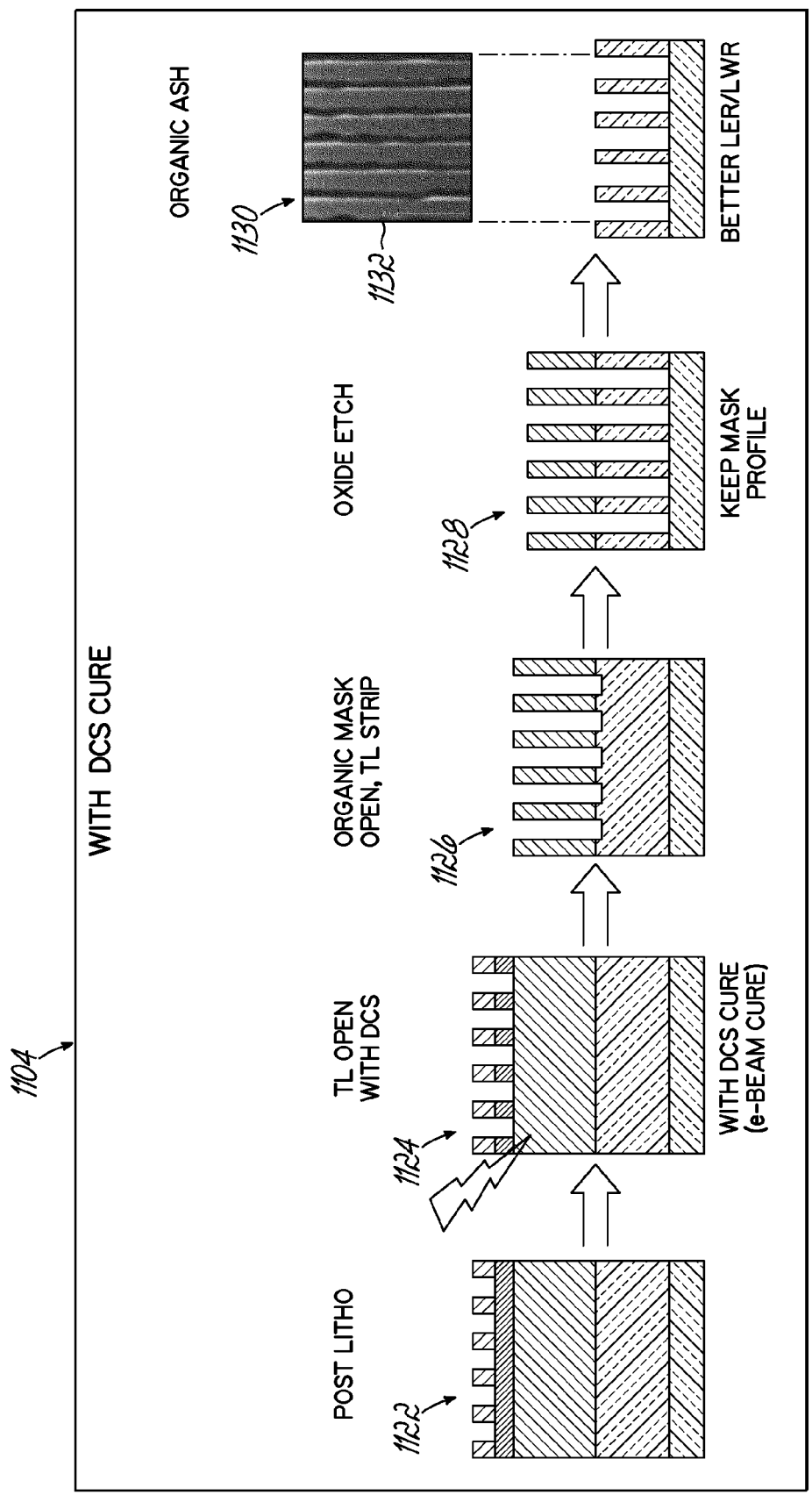
FIG. 11B illustrates the effect of a DCS cure process on the mechanical stability of the organic planarizer layer and resulting downstream pattern roughness, according to an embodiment, as compared to the process without a DCS cure, as illustrated in FIG. 11A.

FIGS. 11A-11B illustrate the effect of a DCS cure process on the mechanical stability of the organic planarizer layer and resulting downstream pattern roughness, according to an embodiment. Process 1102 of FIG. 11A illustrates the results obtained for etching a high aspect ratio substrate without application of a DCS cure process. An aspect ratio of about 5:1 was used in this example, but other aspect ratios are contemplated. Process 1104 of FIG. 11B illustrates improved results obtained for etching a high aspect ratio substrate with application of a DCS cure process. Panel 1106 schematically illustrates the incoming substrate. Panel 1108 schematically illustrates the substrate after the TL open operation has been applied. The third panel 1110 includes a top-down electron microscopy image 1112 showing significant wiggling after the organic mask opening/TL strip process. The fourth panel 1114 includes a top-down electron microscopy image 1116 showing enhanced wiggling after the oxide etch process. Panel 1118 includes a top-down electron microscopy image 1120 showing significant wiggling of the final etched dielectric.

Effects of performing a DCS cure process are illustrated in process 1104 of FIG. 11B. Panel 1122 schematically illustrates the incoming substrate, which is identical to the incoming substrate in process 1102. Panel 1124 schematically illustrates the substrate after the TL open operation has been applied, wherein the TL open operation includes application of a DCS cure process. Panel 1126 schematically illustrates the organic mask open/TL strip operation and panel 1128 schematically illustrates the oxide etch process. Panel 1130 includes a top-down electron microscopy image 1132 of the final etched dielectric. Image 1132 clearly shows improved LER and LWR characteristics, resulting from the DCS cure process of panel 1124, in contrast to image 1120 resulting from the etch process that is performed without the DCS cure process.

FIGS. 11A-11B show the result of two processes with equal post-etch CD and thus planarizer aspect ratio. Without DCS cure in the TL open, the LWR is improved by 34% from incoming (FIG. 11A). Inclusion of a DCS cure prior to TL open (FIG. 11B) provides additional improvement, to a 52% reduction from incoming. Significant improvement of LER and LWR was also observed for substrates having relaxed pitch where the planarizer aspect ratio is well below the 4.5:1 threshold previously identified (results not shown here).

The improved results obtained using the DCS cure process, shown in FIG. 11B, may be due to the interaction of ballistic electrons with the planarizer stack. With scaled resist, TL and planarizer thicknesses, the ballistic electrons may penetrate well into the planarizer stack to provide enhanced mechanical resistance to the stress-induced deformation previously observed during the oxide etch.

Figure 12A:
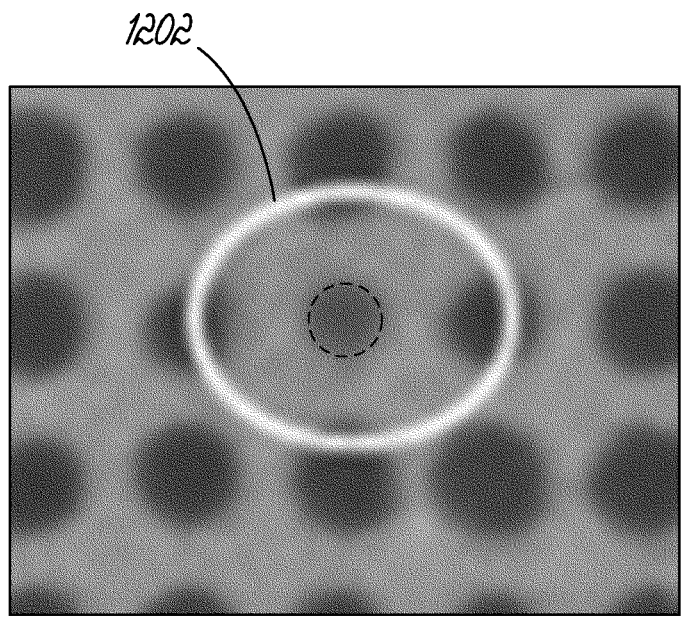
FIGS. 12A-12B illustrate top-down cross section electron microscopy images of scummed contact hole and bridged contact hole defects, respectively.
Figure 12B:
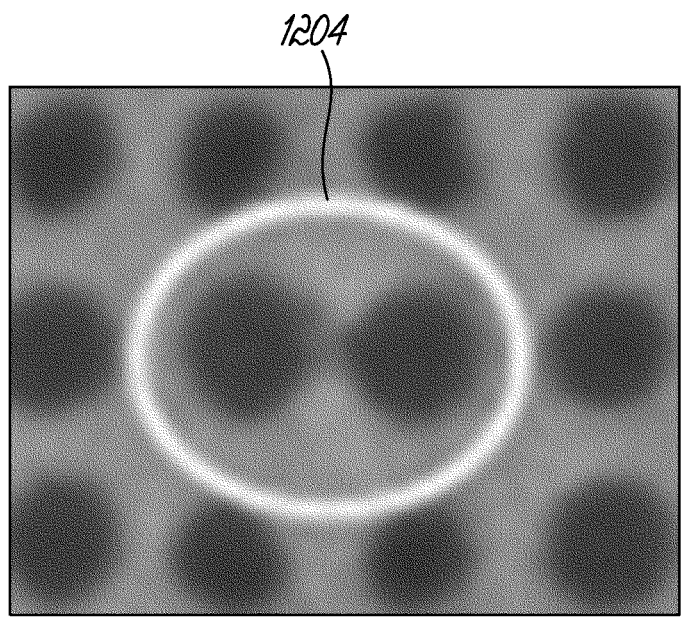

Another pattern fidelity challenge observed for this evaluation is a tradeoff between missing and bridged contacts for a dense 1×1 contact hole array, as shown in FIGS. 12A-12B, which illustrate top-down cross section electron microscopy images of "scummed" contact hole and bridged contact hole defects, respectively. Close inspection of the incoming pattern reveals concurrent scummed contacts 1202, where resist material is incompletely developed from an intended hole, and partially bridged contacts 1204 where the resist height between neighboring contacts is much less than intended.

While conventional etch processes can solve either problem (i.e., scummed contacts 1202 or bridged contacts 1204) independently, there is inadequate PR budget to insert a de-scum process (to cure a scummed defect) prior to TL open. Further, there is insufficient margin for simply tuning PR selectivity of the TL open.

Figure 13:
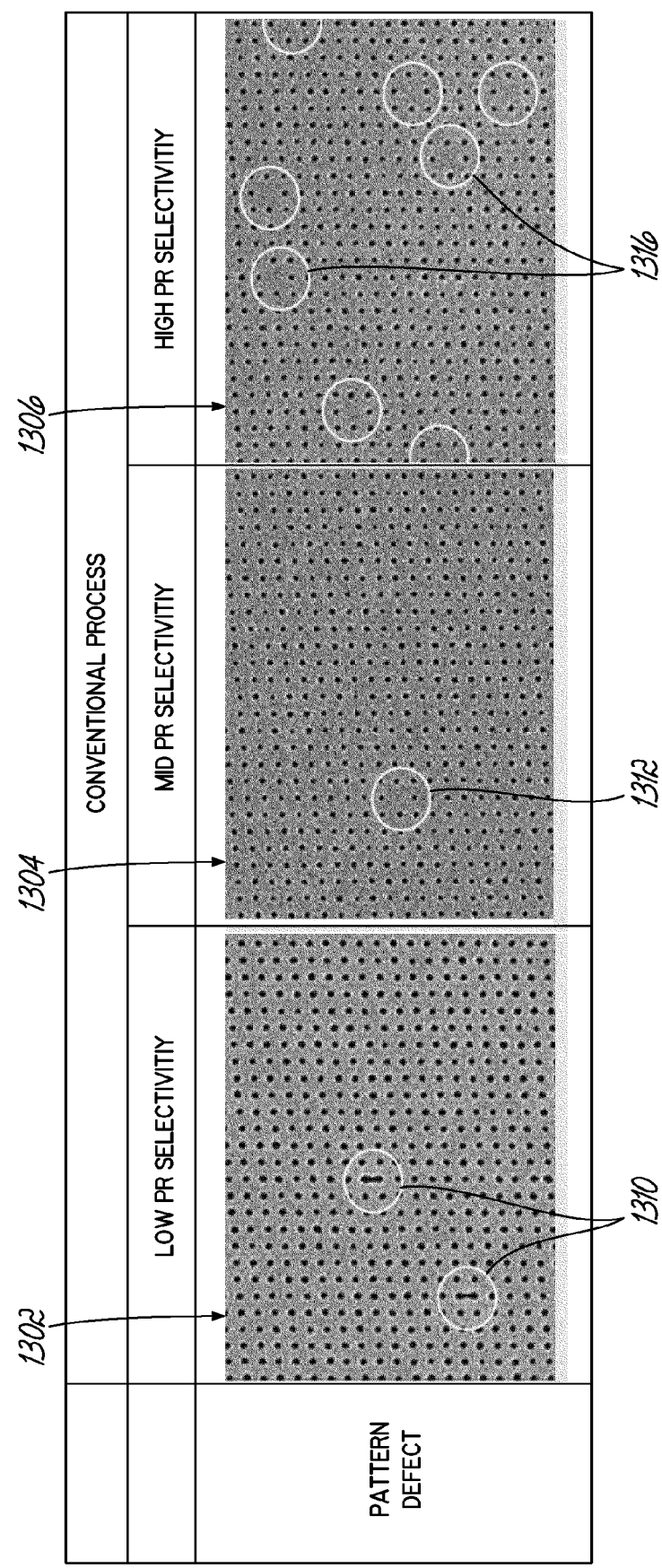
FIG. 13 illustrates results of a conventional approach to reducing defects in a contact hole array based on tuning of PR selectivity.

FIG. 13 represents a conventional approach to reducing defects in a contact hole array based on tuning of PR selectivity. In this example, FIG. 13 shows three arrays 1302, 1304, 1306 with application of low, medium, and high PR selectivity TL open recipes, respectively. The three arrays 1302, 1304, 1306 were each a 1×1 contact hole array with 2200 contacts. For each case, the contacts were inspected for missing or bridged contacts. Although this sampling rate of 2200 contacts is very low for manufacturing level yield analysis, it provides adequate resolution to observe the trade-off between the competing defectivity modes as a function of resist selectivity.

The results of FIG. 13 clearly indicate that there is a tradeoff between bridged contact and scummed contacts as a function of tuning the PR selectivity. For example, at low PR selectivity in array 1302, bridged contacts 1310 form preferentially rather than scummed contacts. However, as PR selectivity is increased to mid PR selectivity in array 1304, and to high PR selectivity in array 1306, scummed contacts 1312, 1316 are formed preferentially over bridged contacts. For example, when a low PR selectivity recipe was used, there were no detected scummed contacts in the array 1302 of 2200 contact holes, while 4 bridged contacts 1310 were observed. When a mid PR selectivity recipe was used, 5 scummed contacts 1312 were observed in the array 1304 of 2200 contact holes, while there were no bridged contacts observed. Lastly, when a high PR selectivity recipe was used, 20 scummed contacts 1316 were observed in the array 1306 of 2200 contact holes, while no bridged contacts were observed.

Figure 14:
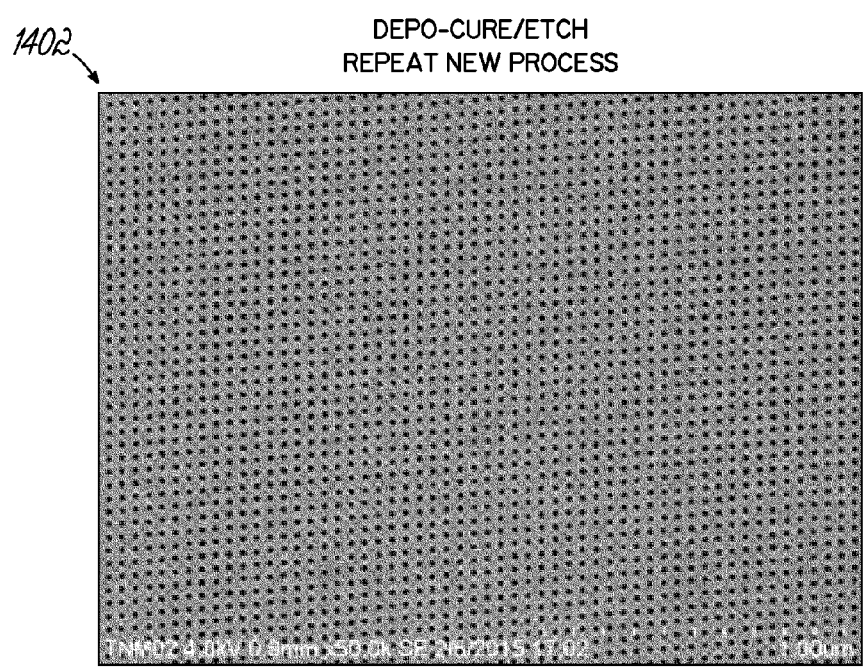
FIG. 14 illustrates results of an approach to reducing defects in a contact hole array based on techniques including the performance of the repeated deposition/etch process, according to an embodiment.

FIG. 14 illustrates results of an approach to reducing defects in a contact hole array based on techniques including the performance of the repeated deposition/etch process (described above and illustrated in FIGS. 5A, 5B, 6, 7, and 8), according to an embodiment. FIG. 14 shows that for the array 1402 of 2200 contact holes there were no scummed defects and no bridge contacts observed. These results show a significant improvement over the conventional approach illustrated in FIG. 13. A possible explanation for these improved results is provided as follows.

Further characterization of the component steps of the high selectivity (7.8:1 as shown in panel 522 in FIG. 5B) deposition/etch process, described above, provided insight into a possible explanation of the improved results of FIG. 14. The results of this investigation are presented in FIG. 15, as follows.

Figure 15:
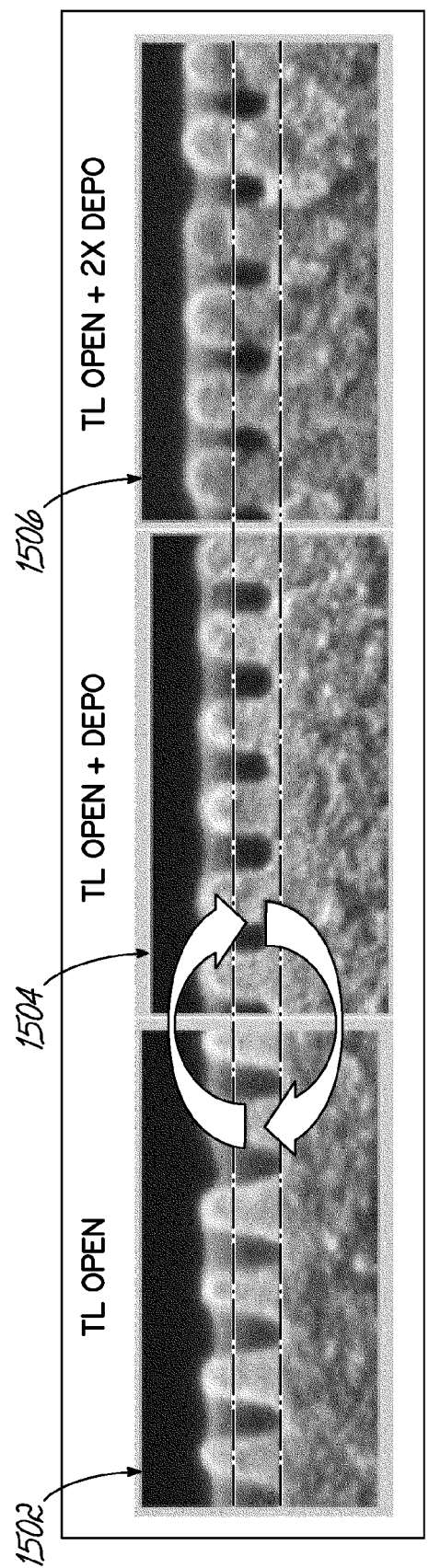
FIG. 15 shows cross section electron microscopy images showing at three stages of TL open etch, according to an embodiment.

FIG. 15 shows cross section electron microscopy images taken at three stages of TL open etch, according to an embodiment. Application of a standard TL open recipe results in a trapezoidal mask shape with monotonic taper, as shown in image 1502. Application of the DCS-enhanced deposition process preferentially deposits CFx polymer on the resist, resulting in a more vertical profile, as shown in image 1504. Doubling the deposition time produces an aspect ratio dependent deposition, evidenced by the rounding of the top of the structure and formation of polymer overhang, as shown in image 1506. This preferential deposition of CFx on the resist in low aspect ratio structures provides a mechanism by which the weak spots of partially bridged contact holes can be passivated without significant deposition on the scumming/remaining resist at the bottom of the higher aspect ratio hole. Cycling this new deposition process with an organic etch/descum was applied prior to TL open, resulting in an apparent elimination of both defect modes (i.e., scummed and bridged contacts) for the 2200 contact holes sampled, as illustrated in FIG. 14.

The disclosed methods, including repetition of a deposition/etch sequence, have successfully demonstrated CCP plasma based etch solutions enabling EUV lithography for trench and contact hole patterning applications. Application of EUV reduces the reticle count, cycle times, integration complexity and intra-level overlay variation for sub 40 nm pitch applications. These methods show promise for meeting the challenge of reducing incoming organic mask thickness to avoid pattern collapse.

The disclosed methods further show the application of DCS in the deposition/etch sequence to be advantageous for improving organic rigidity and etch resistance. DCS also aids in mitigating pattern distortion occurring during the planarizer layer open process, in turn, reducing the downstream pattern roughness. A plasma etch method for providing high resist selectivity during trench patterning and improving defectivity for contact hole patterning applications by selective passivation on resist patterns, was also disclosed.

It is to be appreciated that the Detailed Description section, and not the Abstract section, is intended to be used to interpret the claims. The Abstract section can set forth one or more, but not all exemplary embodiments, of the disclosure, and thus, is not intended to limit the disclosure and the appended claims in any way.

While the disclosed invention has been illustrated by the description of one or more embodiments thereof, and while the embodiments have been described in considerable detail, they are not intended to restrict or in any way limit the scope of the appended claims to such detail. Additional advantages and modifications will readily appear to those of ordinary skill in art. The invention in its broader aspects is therefore not limited to the specific details, representative apparatus and method and illustrative examples shown and described. Accordingly, departures may be made from such details without departing from the scope of the general inventive concept.

What is claimed is:

1. A method for etching through an antireflective coating layer on a substrate, comprising:
    forming a film stack on the substrate, the film stack comprising an underlying organic layer, an antireflective coating layer disposed above the underlying organic layer, and a photoresist layer disposed above the antireflective coating layer;
    patterning the photoresist layer to expose a non-masked portion of the antireflective coating layer;
    selectively depositing a carbon-containing layer on the non-masked portions of the antireflective coating layer and on non-sidewall portions of the patterned photoresist layer;
    etching the film stack to remove the carbon-containing layer and to remove a partial thickness of the non-masked portions of the antireflective coating layer without reducing a thickness of the photoresist layer; and
    repeating the selective depositing and etching at least until the complete thickness of the non-masked portions of the antireflective coating layer is removed to expose the underlying organic layer.

2. The method of claim 1, wherein selectively depositing the carbon-containing layer includes depositing a greater thickness on the non-sidewall portions of the patterned photoresist layer than on the non-masked portions of the antireflective coating layer.

3. The method of claim 1, wherein a direct current potential is applied during the etching to an upper silicon electrode to create a secondary electron emission accelerated to the substrate to facilitate the etching and to sputter silicon atoms that impregnate the photoresist layer upon removal of the carbon-containing layer to render the impregnated photoresist layer more resistant to the etching to further enable removing the partial thickness of the non-masked portions of the antireflective coating layer without reducing the thickness of the photoresist layer.

4. The method of claim 1, wherein the etching is by a reactive ion etch using a plasma generated from $N_2H_2$ gas.

5. The method of claim 4, wherein the underlying organic layer is a planarizer layer, the antireflective coating layer is a SiARC layer, the photoresist layer is an extreme ultraviolet photoresist layer, and the carbon-containing layer is a fluorocarbon.

6. A method of etching a patterned substrate, comprising:
providing a patterned substrate comprising a patterned extreme ultraviolet (EUV) photoresist, a transfer layer (TL), and an organic planarizing layer (OPL);
repeatedly performing a deposition/etch process to selectively and incrementally etch through the TL and into the OPL using the EUV photoresist and TL as a mask to transfer the pattern from the EUV photoresist to the OPL,
wherein the deposition/etch process comprises, in sequence:
 (1) depositing a fluorocarbon layer on the patterned substrate, including on the EUV photoresist and exposed portions of the TL or OPL, and
 (2) performing a reactive ion etching process to remove the fluorocarbon layer and an incremental portion of the TL or OPL selectively relative to the EUV photoresist, and
wherein repeatedly performing the deposition/etch process (1) and (2) results in etching the TL and OPL with greater photoresist etch selectivity than is obtained by performing a reactive ion etch process alone.

7. The method of claim 6, wherein the reactive ion etching process (2) comprises generating a dual frequency capacitively coupled plasma while superposing a direct current potential.

8. The method of claim 7, wherein the dual frequency capacitively coupled plasma comprises $N_2H_2$.

9. The method of claim 8, wherein the direct current potential is applied to a silicon electrode to create silicon species in the dual frequency capacitively coupled plasma generated by sputtering from the silicon electrode, which silicon atoms act to increase the etch selectivity of the EUV photoresist.

10. The method of claim 9, wherein a silicon film forms on the EUV photoresist and acts to increase the etch selectivity of the EUV photoresist.

11. The method of claim 6, wherein the EUV photoresist and the OPL comprise carbon polymers.

12. The method of claim 11, wherein the TL and OPL are preferentially etched in (2) relative to the EUV photoresist.

13. The method of claim 6, wherein the EUV photoresist etch selectivity resulting from repeatedly performing the deposition/etch process is at least 7.8:1.

14. The method of claim 6, wherein the fluorocarbon layer is preferentially deposited on non-sidewall portions of the patterned EUV photoresist relative to the TL.

15. The method of claim 6, wherein repeatedly performing the deposition/etch process (1) and (2) etches the TL and OPL with resulting line width roughening that is improved by at least 52% relative to line width roughening that results from performing a reactive ion etch process alone.

16. The method of claim 6, wherein repeatedly performing of the deposition/etch process (1) and (2) etches the TL and OPL with reduction of both scummed defects and bridge defects relative to results obtained by performing a reactive ion etch process alone.

17. The method of claim 16, wherein the fluorocarbon layer is preferentially deposited to a greater degree on bridge defects than on scummed defects.

18. The method of claim 6, wherein the patterned EUV photoresist has a thickness of less than 60 nm and patterning critical dimension of less than 40 nm, the TL comprises a silicon anti-reflection coating having a thickness of less than 60 nm, and the OPL has a thickness of less than 200 nm.

19. The method of claim 7, wherein ballistic electrons generated through application of the direct current potential modify and harden the EUV photoresist leading to enhanced photoresist selectivity.

20. The method of claim 6, wherein the fluorocarbon layer comprises $CH_3F$ and $CF_4$.

* * * * *